United States Patent
Kim et al.

(10) Patent No.: US 10,008,311 B2
(45) Date of Patent: Jun. 26, 2018

(54) MAGNETIC COMPOSITE POWDERS, PREPARING METHOD THEREOF AND ELECTROMAGNETIC NOISE SUPPRESSING FILMS COMPRISING SAME

(75) Inventors: Sang Woo Kim, Seoul (KR); Ji Hea Park, Incheon (KR); Yoon Bae Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 596 days.

(21) Appl. No.: 12/572,668

(22) Filed: Oct. 2, 2009

(65) Prior Publication Data

US 2010/0181522 A1 Jul. 22, 2010

(30) Foreign Application Priority Data

Jan. 22, 2009 (KR) .................. 10-2009-0005605

(51) Int. Cl.
*H01F 1/26* (2006.01)
*B22F 1/02* (2006.01)
(Continued)

(52) U.S. Cl.
CPC ............... *H01F 1/26* (2013.01); *B22F 1/025* (2013.01); *C22C 19/03* (2013.01); *C22C 19/07* (2013.01); *C22C 30/00* (2013.01); *C22C 38/08* (2013.01); *C22C 38/10* (2013.01); *C23C 18/1639* (2013.01); *C23C 18/1882* (2013.01); *H01F 1/37* (2013.01); *H01F 41/24* (2013.01); *H05K 9/0083* (2013.01); *H05K 1/0233* (2013.01)

(58) Field of Classification Search
CPC ......... B22F 1/025; C22C 19/03; C22C 19/07; C22C 30/00; C22C 38/08; C22C 38/10; C23C 18/1639; C23C 18/1882; H01F 1/26; H01F 1/37; H01F 41/24
See application file for complete search history.

(56) References Cited

U.S. PATENT DOCUMENTS 5,755,986 A * 5/1998 Yamamoto et al. ....... 252/62.54
6,797,401 B2 * 9/2004 Herron ..................... 428/553
(Continued)

FOREIGN PATENT DOCUMENTS

CN 1772707 A * 5/2006
JP 2002093607 3/2002
(Continued)

OTHER PUBLICATIONS

Fečková "Surface Treatment of Powder Material by Metal Coatings—Study of Corrosion Properties." Journal of Metals, Materials and Minerals. 17.1 (2007): 41-43.*

(Continued)

*Primary Examiner* — Holly Rickman
*Assistant Examiner* — Lisa Chau
(74) *Attorney, Agent, or Firm* — Ladas & Parry LLP (57) ABSTRACT

This invention relates to a magnetic composite powder, a method of preparing the same and an electromagnetic noise suppressing film comprising the same. The magnetic composite powder and the electromagnetic noise suppressing film can effectively suppress unwanted electromagnetic waves emitted by various parts of an advanced digital device having high performance characteristics in terms of speed, frequency and functionality.

17 Claims, 7 Drawing Sheets

(51) Int. Cl.
*C22C 19/03* (2006.01)
*C22C 19/07* (2006.01)
*C22C 30/00* (2006.01)
*C22C 38/08* (2006.01)
*C22C 38/10* (2006.01)
*C23C 18/16* (2006.01)
*C23C 18/18* (2006.01)
*H01F 1/37* (2006.01)
*H01F 41/24* (2006.01)
*H05K 9/00* (2006.01)
*H05K 1/02* (2006.01)

(56) References Cited

U.S. PATENT DOCUMENTS

| | | | |
|---|---|---|---|
| 7,218,266 B2 * | 5/2007 | Fujieda et al. | 342/1 |
| 2002/0090513 A1 * | 7/2002 | Watanabe et al. | 428/402 |
| 2003/0010408 A1 * | 1/2003 | Hosoe et al. | 148/310 |
| 2006/0099454 A1 * | 5/2006 | Morikoshi et al. | 428/692.1 |
| 2006/0165985 A1 * | 7/2006 | Matsukawa et al. | 428/384 |
| 2006/0280944 A1 * | 12/2006 | Tung et al. | 428/403 |
| 2007/0031670 A1 * | 2/2007 | Fournier et al. | 428/375 |
| 2007/0151417 A1 * | 7/2007 | Kaneko et al. | 75/252 |
| 2007/0172663 A1 * | 7/2007 | Yui | 428/411.1 |
| 2007/0210274 A1 | 9/2007 | Bose | |
| 2007/0281176 A1 * | 12/2007 | Palumbo | A01K 87/00 428/457 |
| 2008/0026220 A9 * | 1/2008 | Bi et al. | 428/402 |

FOREIGN PATENT DOCUMENTS

| | | |
|---|---|---|
| JP | 2002093607 A * | 3/2002 |
| JP | 2003185065 | 7/2003 |
| KR | 100712836 | 4/2007 |
| KR | 1020070045430 | 5/2007 |
| WO | WO 2008007346 A2 * | 1/2008 |

OTHER PUBLICATIONS

Xie et al. "Ni—Fe—Co—P coatings on coiled carbon nanofibers." Carbon. 43 (2005): 3181-3183.*

Psaila et al., "Electroformed Nanocrystalline Coatings an Advanced Alternative to Hard-Chrome Electroplating PP-1152" Strategic Environmental Research and Development Program, Sep. 26, 2002, Slides 1-22.*

Perera et al., "Ti—Al—O—N Spinel Composite—A New Engineering Ceramic." Key Engineering Materials, 53-55 (1991): 338-343.*

Yoshida, S., et al., "Crystal structure and microwave permeability of very thin Fe—Si—Al flakes produced by microforging," J. Applied Phy., 93:10, May 15, 2003, pp. 6659-6661.

Yun, Y.W., et al., "Electromagnetic shielding properties of soft magnetic metal and ferrite composites for application to suppress noise in a radio frequency range," J. Electroceram, 17, 2006, pp. 467-469.

Ji-Hea Park, et al; "Formation of Ni—Co—P Nanogranular Layer on Plate-like Fe—Al—Si Particles via Electroless Deposition Route and Its Effect on the Magnetic Properties", Asian Magnetics Conference 2008 & KMS 2008 Winter Conference, Dec. 10-13, 2008, Busan, Korea, p. 163, Document No. CR06.

* cited by examiner

MAGNETIC COMPOSITE POWDERS, PREPARING METHOD THEREOF AND ELECTROMAGNETIC NOISE SUPPRESSING FILMS COMPRISING SAME

FIELD OF THE INVENTION

The present invention relates to a magnetic composite powder which can effectively block undesirable electromagnetic waves, a method of preparing the magnetic composite powder, and an electromagnetic noise suppressing film containing the magnetic composite powder.

BACKGROUND OF THE INVENTION

The demand for advanced digital devices having high-speed, high-frequency and high-functional characteristics with a reduced size has recently been increasing, in addition to the increased flexibility required for flexible electronic devices. In order to meet such demand, there is a tendency to incorporate into a device hybrid active/passive elements radiating a dielectric noise. However, such hybridization may increase linear coupling due to capacitive coupling as well as inductive coupling and cause interference due to the action of the radiation noise, which tends to cause frequent malfunction of the device. In some cases, such noise may negatively affect other external devices.

To suppress the radiation noise, particularly in the range of from 100 MHz to 20 GHz, and the electromagnetic interference for such advanced devices, there have been developed a method of using a low pass filter and shielding. However, the functional part used in such method requires a large mounting space, and accordingly, such method is not suitable for a small digital device or a product having a short life. Furthermore, inductance parts are unsuitable for use in the Radio Frequency (Hereinafter, refer to "RF") range.

In response to the trend of reducing the size of a digital device, the demand for developing an ultra thin noise suppressing film usable in the RF range has been increasing. A conventional electromagnetic shielding material containing Cu, Ag, or others is applied mainly on the cover of a digital device or is mounted on the housing thereof so as to shield undesirable electromagnetic waves coming from outside. However, such a conventional material cannot deal effectively with the radiation noise as well as conductive noise occurring between the circuits within the device. Also, in case an electromagnetic absorbing sheet of a ferrite or sendust alloy having good shielding properties is used, the thickness thereof cannot be reduced to a satisfactory level because the magnetic permeability drastically decreases with the increase in the frequency. In the frequency range of tens to hundreds of MHz, parts such as a coil or filter may be used, but not in the above mentioned RF range. Even if passive parts useful in the RF range are provided, immense costs are required to change the design of the substrate and others.

The above-mentioned problems may be solved through the development of a noise-suppressing film containing a magnetic powder capable of suppressing unwanted electromagnetic noises. Such a film may be used at a frequency range higher and wider than hundreds of MHz has been possible, if it can be fabricated in the form of an ultra thin film. Accordingly, there is a need to develop such a thin noise suppressing film.

With regard to conventional noise suppressing films, Japanese Patent Publication No. 2005-019846 discloses a method for manufacturing a noise suppressing film using a spherical or crushed soft magnetic metal oxide powder of a magnetic ferrite or sendust alloy having an average diameter of 0.1~10 μm. However, the soft magnetic metal oxide powder used therein produces unsatisfactorily low responses at a high frequency range. Also, the literature ('Crystal structure and microwave permeability of very thin Fe—Si—Al flakes produced by microforging', Shigeyoshi Yoshida, Journal of applied physics, 93[10], 2003, pp. 6659) describes a method for manufacturing a noise suppressing film using Fe—Si—Al flakes as an electromagnetic absorbing material. Although an enhanced frequency response of the soft magnetic alloy is attempted by performing high-energy milling, the high frequency response in the desired RF range has remained unsatisfactory.

Thus, the conventional materials cannot effectively suppress unneeded electromagnetic waves generated by advanced devices having a reduced size. In case of an ultra thin device, it also becomes very difficult to effectively cope with the heat emitted from various parts of the device such as printed circuit board (PCB) and flexible PCB (FPCB). Therefore, there is a need to develop a thin functional electromagnetic composite film which is able to overcome the limitations of the conventional materials and withstand a high-temperature condition generated by the heat emitted by various parts in a down-sized device.

SUMMARY OF THE INVENTION

Accordingly, it is an object of the present invention to provide a magnetic composite powder which is capable of effectively suppressing unwanted electromagnetic waves generated in an advanced digital device having a reduced size.

It is another object of the present invention to provide a method of preparing the magnetic composite powder.

It is a further object of the present invention to provide an electromagnetic noise suppressing film comprising said magnetic composite powder.

In accordance with an aspect of the present invention, there is provided a magnetic composite powder having a core-shell structure, comprising a core particle having shape anisotropy which is selected from the group consisting of a magnetic material, a ceramic, and a mixture thereof, and a magnetic layer formed on the surface of the core particle.

In accordance with another aspect of the present invention, there is provided a method of preparing the magnetic composite powder, comprising forming a magnetic layer by an electroless plating method on the surface of the core particle.

In accordance with a further aspect of the present invention, there is provided an electromagnetic noise suppressing film, comprising a matrix resin, and the magnetic composite powder disposed in the matrix resin in a unidirectionally oriented manner.

BRIEF DESCRIPTION OF THE DRAWINGS

The above and other objects and features of the present invention will become apparent from the following description of the invention, when taken in conjunction with the accompanying drawings, which show.

BRIEF DESCRIPTION OF THE REFERENCE NUMERALS IN DRAWINGS 10, 20: magnetic composite powder
11, 21: core particle
12, 22: magnetic layer
23: insulating layer

DETAILED DESCRIPTION OF THE INVENTION

Hereinafter, a detailed description will be given of the present invention.

In the present specification, the term "shape of a plate" indicates a shape like a flat plate having an aspect ratio (which is a D/t ratio of a maximum diameter (D) of a principle plane to a thickness (t) in a direction perpendicular to the principle plane) of 2 or more.

Also in the present specification, the term "shape of a needle" indicates a thin and pointed shape like a needle having an aspect ratio (which is a D/d ratio of a maximum diameter (D) of a principle plane to a minimum diameter (d) thereof) of 2 or more.

In the present specification, the phrase "unidirectionally oriented" indicates that magnetic powder is entirely oriented in a direction parallel to the lengthwise direction of the film.

The present invention provides a magnetic composite powder having a core-shell structure, comprising a core particle having shape anisotropy which is selected from the group consisting of a magnetic material, a ceramic, and a mixture thereof, and a magnetic layer formed on the surface of the core particle.

Figure 1:
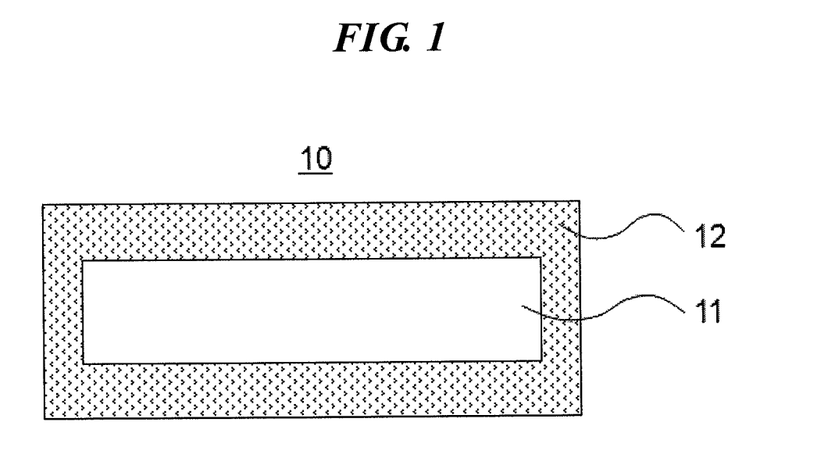
FIG. 1: a schematic cross-sectional view of the magnetic composite powder according to an embodiment of the present invention.

FIG. 1 is a schematic cross-sectional view of the magnetic composite powder according to an embodiment of the present invention. As shown in FIG. 1, the magnetic composite powder 10 according to the present invention is provided in the form of a core-shell structure comprising a core particle 11 having shape anisotropy and a magnetic layer 12 formed on the surface of the core particle 11.

The core particle 11 may be selected from the group consisting of a magnetic material, a ceramic, and a mixture thereof. The magnetic material may include ferrite, a soft magnetic alloy and so on. Examples of the soft magnetic alloy include crystalline alloys such as Fe—Al—Si, Fe—Al—B—Nb—Cu, Fe—Al—B—Nb, Fe—Si—B, Fe—Si and Fe—Cr; and amorphous alloys composed mainly of one or more selected from the group consisting of Fe, Co and Ni, such as Fe—Cr—Mo—C—B, Fe—Si—B—C, Fe—Si—B—C—P, Fe—Cr—B—Si—C, Fe—Si—B—Nb, Fe—Zr—B—(Ni), Fe—Cu—Nb—Si—B, Fe—Co—Ni—Zr—B, Fe—Al—B—(Nb, Cu), Fe—Nb—B, Fe—Zr—B—Cu, Fe—Cr—Mo—C—B, Co—Fe—Si—B, Co—Fe—Ni—(Mo)—B—Si, Ni—Cr—Fe—Si—B, Ni—Nb—Cr—Mo—P—B and Ni—B—Si.

Examples of the ceramic include inorganic material having flame retardancy and heat dissipation properties, such as magnesium hydroxide, magnesium hydroxide carbonate, aluminum hydroxide, phosphoric acid, zinc borate, boric acid, zinc tartrate, titanium oxide, antimony oxide, copper oxide, silicon oxide, alumina, zirconia, boron nitride, and aluminum nitride.

In order to impart an electromagnetic noise suppressing function as well as a flame retardancy and heat dissipation properties, a core particle of the magnetic material and a core particle of the ceramic may be used alone or in a mixture thereof.

The core particle 11 has the shape of a plate or a needle. In case the core particle has the shape of a plate, an aspect ratio of the core particle may be in the range of 2 to 200, the aspect ratio being defined as the D/t ratio of a maximum diameter (D) of a principle plane to a thickness (t) in a direction perpendicular to the principle plane. And, in case the core particle has the shape of a needle, an aspect ratio of the core particle may be in the range of 2 to 200, the aspect ratio being defined as the D/d ratio of a maximum diameter (D) of a principle plane to a minimum diameter (d) thereof. In particular, the core particle may have an aspect ratio ranging from 10 to 100 so as to have high shape anisotropy.

The core particles have shape anisotropy due to the shape of their own, and the magnetic layer formed on the core layer also has high shape anisotropy, to provide a high frequency response.

Provided on the surface of the core particle 11 is the magnetic layer 12 to form the core-shell structure.

The magnetic layer 12 includes a ferromagnetic material whose frequency response is different from that of the core particle and thus attenuates or removes unwanted electromagnetic waves in the wide frequency range. The ferromagnetic material may be selected from the group consisting of Co, Fe, Ni and a combination thereof, and the ferromagnetic material may further comprise any one selected from the group consisting of Cu, Zn and a combination thereof. Furthermore, because the magnetic layer 12 according to the present invention is formed by an electroless plating method, it may further comprise any one selected from the group consisting of B, P and a combination thereof depending on the type of reducing agent used upon the electroless plating process.

Examples of the ferromagnetic material may include mixtures such as Co—Ni—P, Co—Fe—P, Fe—Co—Ni—P, Co—Ni—B, Co—Fe—B, Fe—Co—Ni—P—B, Fe—Ni—P, Fe—Ni—B, Fe—Ni—Zn—P, Fe—Ni—Zn—B, Fe—Ni—Cu—P, Fe—Ni—Cu—B, Co—Ni—Zn—P, Co—Fe—Zn—P, Fe—Co—Ni—Zn—P, Co—Ni—Cu—P, Co—Fe—Cu—P, Fe—Co—Ni—Cu—P, Co—Ni—Cu—B, Co—Fe—Cu—B, Fe—Co—Ni—Cu—B, Fe—Ni—Zn—Cu—P and Fe—Ni—Zn—Cu—B.

Preferably the ferromagnetic material is a mixture of Co and Ni having a Co/(Co+Ni) atomic ratio of 0.1 to 9, a mixture of Ni and Fe having a Ni/(Ni+Fe) atomic ratio of 0.1 to 9, or a mixture of Co and Fe having a Co/(Co+Fe) atomic ratio of 0.1 to 9. When the atomic ratios of Co/(Co+Ni), Co/(Co+Fe) and Ni/(Ni+Fe) fall in the above ranges, superior frequency response may be obtained. More preferably the ferromagnetic material is a mixture of Co and Ni having a Co/(Co+Ni) atomic ratio of 0.1 to 0.9, a mixture of Ni and Fe having a Ni/(Ni+Fe) atomic ratio of 0.1 to 0.9, or a mixture of Co and Fe having a Co/(Co+Fe) atomic ratio of 0.1 to 0.9.

The magnetic layer 12 may be provided in the form of a thin film on the surface of the core particle by an electroless plating, and specifically may have a thickness ranging from 0.05 µm to 5 µm. When the thickness of the magnetic layer falls in the above range, superior high-frequency response may be obtained.

Also, an insulating layer may be provided between the core particle 11 and the magnetic layer 12.

Figure 2:
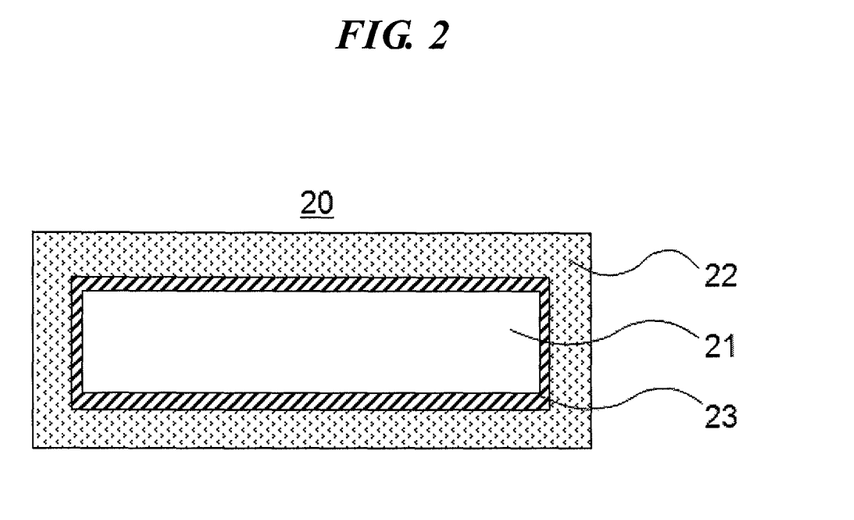
FIG. 2: a schematic cross-sectional view of the magnetic composite powder according to another embodiment of the present invention.

FIG. 2 is a schematic cross-sectional view showing magnetic composite powder according to another embodiment of the present invention. As shown in FIG. 2, an insulating layer 23 may be disposed between a core particle 21 and a magnetic layer 22.

The insulating layer 23 plays a role in forming a bond with the magnetic layer 22 or increasing an electrical resistivity and a frequency response of the magnetic layer 22 upon the thermal treatment, and may be composed of an oxide, a nitride or a carbide. Specific examples thereof include oxides such as Al—O-based aluminum oxide, Si—O-based silicon oxide, and Fe—Al—Si—O; nitrides such as aluminum nitride (AlN), boron nitride (BN), $Si_3N_4$, Si—Al—O—N, and Ti—Al—O—N; and carbides such as SiC, TiC and Ti—Al—C.

The insulating layer 23 may have a thickness ranging from ones to tens of nm. Specifically, when the insulating layer 23 has a thickness ranging from 1 nm to 20 nm, exchange interaction effects may be increased.

The present invention also provides a method of preparing the magnetic composite powder.

The inventive magnetic composite powder may be prepared by the method comprising forming a magnetic layer by an electroless plating method on the surface of the core particle.

The core particle has the same characteristics and properties as mentioned above.

The electroless plating may be performed by a typical process.

Specifically, when the ferromagnetic material for forming the magnetic layer is used, a Co source and a Ni source having a Co/(Co+Ni) atomic ratio of 0.1 to 9, more preferably 0.1 to 0.9, a Co source and a Fe source having a Co/(Co+Fe) atomic ratio of 0.1 to 9, more preferably 0.1 to 0.9, or a Ni source and a Fe source having a Ni/(Ni+Fe) atomic ratio of 0.1 to 9, more preferably 0.1 to 0.9 are dissolved in distilled water to a concentration of 5~500 g/l and a reducing agent is added to the resulting solution, to obtain a plating bath.

Examples of the Co source may include cobalt nitrate, cobalt acetate hydrate, cobalt chloride, and cobalt sulfate, and examples of the Ni source may include nickel nitrate, nickel acetate hydrate, nickel chloride, and nickel sulfate. Examples of the Fe source may include iron nitrate, iron acetate, iron hydrochloride, and iron sulfate. In case the ferromagnetic material selectively further comprises Cu or Zn, examples of the Cu source may include copper nitrate, copper acetate, copper chloride and copper sulfate, and examples of the Zn source may include zinc nitrate, zinc acetate, zinc chloride or zinc sulfate.

The reducing agent may include sodium hypophosphite ($NaH_2PO_2.H_2O$), sodium boron hydride ($NaBH_4$), dimethylamine boride ($C_2H_{10}BN$), sodium cyanide (NaCN), and paraformaldehyde, and may be used to a concentration of 1 g/l to 100 g/l.

In order to increase plating efficiency of the plating bath, added may be an activating agent such as octyl ethanoate, butanoic acid ($CH_3CH_2CH_2COOH$) or ethanoic acid (or acetic acid, $CH_3COOH$) to a concentration of 1 g/l to 100 g/l; a complexing agent such as succinic acid ($HOOCCH_2CH_2COOH$), citric acid ($H_3C_6H_5O_7$), sodium citrate, lactic acid (or hydroxypropanoic acid, $C_3H_6O_3$), glycolic acid (or hydroxyacetic acid, $C_2H_4O_3$), a Rochelle salt (or potassium sodium tartrate, $C_4H_4O_6NaK.4H_2O$) or sodium pyrophosphate to a concentration of 1 g/l to 50 g/l; a stabilizer such as sodium tartrate, 2,2-bipyridine (($C_5H_4N$)$_2$) or tetramethylthiourea to a concentration of 0.1 mg/l to 100 mg/l; a buffering agent such as sodium citrate tribasic dehydrate to a concentration of 1 g/l to 50 g/l; and an improver for improving properties, such as polyethylene glycol, ethylene diamine, and polyvinylpyridine (PVP) to a concentration of 1 g/l to 10 g/l. Also, the plating rate, the use efficiency of the reducing agent, and the properties of the plated magnetic layer may vary depending on the pH of the plating bath. Accordingly, a pH controller such as aqueous ammonia, potassium hydroxide, sodium hydroxide, hydrochloric acid, sulfuric acid, nitric acid, and acetic acid may be used so that the pH of the plating bath is adjusted in the range of 5 to 12. In particular, the pH may be in the range of 10 to 12 in order to increase a reducing power.

The electroless plating may be performed at 20° C. to 110° C. for 1 min to 200 min.

In case the insulating layer is disposed between the core particle and the magnetic layer, forming the insulating layer may precede forming the magnetic layer.

The insulating layer may be formed by subjecting a composition for forming the insulating layer comprising oxide, nitride or carbide to typical slurry coating or by subjecting the core particle to thermal treatment in a predetermined gas atmosphere.

In case the insulating layer comprising oxide is formed by thermally treating the core particle at a temperature ranging from 300° C. to 1200° C. in an argon/oxygen mixed gas atmosphere. Also, in order to effectively control the formation of the insulating layer, a mass flow controller (MFC) may be further used. In case the insulating layer comprising nitride is formed by thermally treating the resulting core particle at a temperature ranging from 300° C. to 1200° C. in a nitrogen or ammonia gas atmosphere to form a nitride layer. Also, in case the insulating layer comprising carbide is formed by thermally treating the core particle at a temperature ranging from 300° C. to 1200° C. in an argon or nitrogen/argon mixed gas atmosphere to form a carbonized layer on the surface of the core particles.

The magnetic composite powder prepared using the above method has superior high-frequency response to shield undesirable electromagnetic waves emitted from external electronic devices, to prevent electromagnetic waves generated within the electronic devices from being emitted to the outside, and to prevent malfunction of the devices attributable to interference or radiation noise occurring between the transfer circuits within the device. Thereby, the magnetic composite powder according to the present invention can effectively suppress unwanted electromagnetic waves emitted by an advanced digital device having high performance characteristics in terms of speed, frequency and functionality.

The inventive magnetic composite powder may be used in the form of a magnetic composite by mixing with polymer resin such as polyethylene chloride, acrylic resin or silicone resin, and then forming into a toroidal or gasket shape. Also, the magnetic composite powder may be used in the form of a film, which may be attached or inserted to the inside or topside of PCBs, digital devices, polymer films or FPCs which radiate electromagnetic noise, so as to suppress unwanted electromagnetic noise.

Accordingly, the present invention also provides an electromagnetic noise suppressing film, comprising a matrix resin, and the magnetic composite powder disposed in the matrix resin in a unidirectionally oriented manner.

The matrix resin may be selected from the group consisting of acrylic resin, polyethylene chloride resin, polyethylene resin and polypropylene resin. The magnetic composite powder may be contained in an amount of 10~95 wt % in the matrix resin based on the total weight of the film.

The inventive electromagnetic noise suppressing film can effective noise attenuation properties in the RF range even when it is a thin film particularly having a thickness ranging from 0.02 mm to 5 mm due to the superior high-frequency response of the magnetic composite powder.

Also the inventive electromagnetic noise suppressing film is a flexible thin film, and thus can be disposed on circuits, wires, or flexible devices such as cables and FPCBs, which radiate noise.

The electromagnetic noise suppressing film according to the present invention can exhibit effective noise attenuation properties in the RF range, and thus can be mounted in electronic devices radiating noise, such as silicon circuit boards, hard circuit boards, PCBs, mobile phones, cordless telephones, digital cameras and office automation systems, or on outer coating covers or other polymer films thereof, thereby preventing internal interference due to electromagnetic noise, unnecessary signal interference due to cross-talk and malfunction. Furthermore, the electromagnetic noise suppressing film has high flexibility and thus the passive element may not be mounted in the form of a part but may be applied in a thin form or embedded form, thereby reducing EMI of hard/soft circuit devices or flexible devices such as cables and parts and increasing heat dissipation. Also, the electromagnetic noise suppressing film is useful as an EMC (electromagnetic compatibility)/EMI material, a noise suppressive magnetic sheet, or a heat dissipation noise suppressing film.

The following Examples are given for the purpose of illustration only, and are not intended to limit the scope of the invention.

EXAMPLES

Examples 1 to 16: Preparation of Magnetic Composite Powders

Various magnetic composite powders having a Co—Ni magnetic layer were prepared by using a non-electrolytic electroless plating method under the conditions shown in Table 1.

Specifically, specified amounts of nickel nitrate and cobalt nitrate were mixed as shown in Table 1 and dissolved in distilled water to a concentration of 50 g/l. Added to the resulting solution were succinic acid (to a concentration of 10 g/l, as a complexing agent), octyl ethanolate (to a concentration of 10 g/l, as an activating agent), sodium citrate (to a concentration of 50 g/l, as a buffering agent), and sodium hypophosphite (to a concentration of 25 g/l, as a reducing agent), and the pH of the resulting mixture was adjusted by adding aqueous ammonia, to obtain a plating bath. Subsequently, plate-like core particles of an Fe—Al—Si alloy (aspect ratio: 40) were placed in the plating bath, followed by performing electroless plating at 35° C., to obtain a magnetic composite powder.

TABLE 1

|  | Material Co/(Co + Ni) (Atomic ratio) | pH | Time (min) | Magnetic Layer Co/(Co + Ni) (Atomic ratio) |
|---|---|---|---|---|
| Ex. 1 | 0.5 | 8.5 | 15 | 0.25 |
| Ex. 2 | 0.5 | 8.5 | 35 | 0.25 |
| Ex. 3 | 0.5 | 8.5 | 65 | 0.25 |
| Ex. 4 | 0.5 | 9.5 | 15 | 0.21 |
| Ex. 5 | 0.5 | 9.5 | 25 | 0.33 |
| Ex. 6 | 0.5 | 9.5 | 30 | 0.30 |
| Ex. 7 | 0.5 | 9.5 | 55 | 0.20 |
| Ex. 8 | 0.5 | 9.5 | 65 | 0.26 |
| Ex. 9 | 0.5 | 10.5 | 15 | 0.15 |
| Ex. 10 | 0.5 | 10.5 | 35 | 0.24 |
| Ex. 11 | 0.5 | 10.5 | 65 | 0.28 |
| Ex. 12 | 0.5 | 9.5 | 35 | 0.32 |
| Ex. 13 | 0.6 | 9.5 | 35 | 0.32 |
| Ex. 14 | 0.7 | 9.5 | 35 | 0.40 |
| Ex. 15 | 0.8 | 9.5 | 35 | 0.57 |
| Ex. 16 | 0.9 | 9.5 | 35 | 0.72 |

Examples 17 to 27: Preparation of Magnetic Composite Powders

Various magnetic composite powders having a Co—Fe magnetic layer were prepared by using a non-electrolytic electroless plating method under the conditions shown in Table 2.

Specifically, specified amounts of cobalt nitrate and iron nitrate were mixed as shown in Table 2 and dissolved to in distilled water to a concentration of 40 g/l. Added to the resulting solution succinic acid (to a concentration of 15 g/l, as a complexing agent), octyl ethanolate (to a concentration of 20 g/l, as an activating agent), sodium citrate (to a concentration of 50 g/l, as a buffering agent), and sodium hypophosphite (to a concentration of 25 g/l, as a reducing agent), and the pH of the resulting mixture was adjusted by adding aqueous ammonia, to obtain a plating bath. Subsequently, plate-like core particles of Fe—Al—Si alloy (aspect ratio: 40) were placed in the plating bath, followed by performing electroless plating at 80° C., to obtain a magnetic composite powder.

TABLE 2

|  | Material Co/(Co + Fe) (Atomic ratio) | pH | Time (min) | Temp. (° C.) |
|---|---|---|---|---|
| Ex. 17 | 0.6 | 7.0 | 15 | 80 |
| Ex. 18 | 0.7 | 7.0 | 15 | 80 |
| Ex. 19 | 0.8 | 7.0 | 15 | 80 |
| Ex. 20 | 0.9 | 7.0 | 15 | 80 |
| Ex. 21 | 0.8 | 8.5 | 15 | 80 |
| Ex. 22 | 0.9 | 8.5 | 15 | 80 |
| Ex. 23 | 0.7 | 7.0 | 35 | 90 |
| Ex. 24 | 0.7 | 7.5 | 15 | 90 |
| Ex. 25 | 0.7 | 7.5 | 35 | 90 |
| Ex. 26 | 0.6 | 8.5 | 15 | 90 |
| Ex. 27 | 0.6 | 8.5 | 35 | 90 |

Examples 28 to 34: Preparation of Magnetic Composite Powders

Various magnetic composite powders having a Co—Ni magnetic layer were prepared by using a non-electrolytic electroless plating method under the conditions shown in Table 3.

Specifically, specified amounts of cobalt nitrate and nickel nitrate were mixed as shown in Table 3 and dissolved to in distilled water to a concentration of 40 g/l. Added to the resulting solution succinic acid (to a concentration of 15 g/l, as a complexing agent), octyl ethanolate (to a concentration of 20 g/l, as an activating agent), sodium citrate (to a concentration of 50 g/l, as a buffering agent), and sodium hypophosphite (to a concentration of 25 g/l, as a reducing agent), and the pH of the resulting mixture was adjusted by adding aqueous ammonia, to obtain a plating bath. Subsequently, plate-like core particles of BN (aspect ratio: 20) were placed in the plating bath, followed by performing electroless plating, to obtain a magnetic composite powder.

TABLE 3

|  | Material Co/(Co + Ni) (Atomic ratio) | pH | Time (min) | Temp. (° C.) |
|---|---|---|---|---|
| Ex. 28 | 0.9 | 9.5 | 35 | 35 |
| Ex. 29 | 0.9 | 9.5 | 35 | 50 |
| Ex. 30 | 0.9 | 9.5 | 35 | 45 |
| Ex. 31 | 0.9 | 9.5 | 35 | 40 |
| Ex. 32 | 0.9 | 9.5 | 35 | 30 |
| Ex. 33 | 0.9 | 9.5 | 35 | 20 |
| Ex. 34 | 0.9 | 9.5 | 35 | 25 |

Evaluation of Properties of Magnetic Composite Powders

To evaluate magnetic properties of the magnetic composite powders of Examples 12 to 16 and 28 to 34, magnetic hysteresis curves of the magnetic composite powders of Examples 12 to 16 and 28 to 34 were prepared by using a VSM (vibrating sample magnetometer) (Lake Shore Model 7404, Lake Shore Co.) system, and a saturation magnetization and a coercive force of each magnetic composite powders were measured from the obtained curves. The results are shown in Table 4.

TABLE 4

|  | Material Co/(Co + Ni) (Atomic ratio) | Magnetic Layer Co/(Co + Ni) (Atomic ratio) | Saturation Magnetization (emu/g) | Coercive Force (Oe) |
|---|---|---|---|---|
| Ex. 12 | 0.5 | 0.32 | 95.2 | 17.0 |
| Ex. 13 | 0.6 | 0.32 | 98.7 | 24.7 |
| Ex. 14 | 0.7 | 0.40 | 102.7 | 17.4 |
| Ex. 15 | 0.8 | 0.57 | 110.3 | 16.8 |
| Ex. 16 | 0.9 | 0.72 | 116.6 | 13.6 |
| Ex. 28 | 0.9 | 0.9 | 222.7 | 104.6 |
| Ex. 29 | 0.9 | 0.9 | 192.8 | 92.0 |
| Ex. 30 | 0.9 | 0.9 | 184.4 | 91.7 |
| Ex. 31 | 0.9 | 0.9 | 157.2 | 124.0 |
| Ex. 32 | 0.9 | 0.9 | 117.3 | 125.3 |
| Ex. 33 | 0.9 | 0.8 | 106.3 | 159.8 |
| Ex. 34 | 0.9 | 0.9 | 102.7 | 153.6 |

As can be seen from the result of Table 4, the magnetic composite powder of Example 16 comprising Fe—Al—Si core particle and a Co—Ni magnetic layer in a Co/Ni atomic ratio of 0.9 exhibited the greatest magnetic properties among Example 12 to 16. The magnetic composite powder of Example 28 comprising BN core particle and a Co—Ni magnetic layer in a Co/Ni atomic ratio of 0.9 exhibited the best saturation magnetization among Example 28 to 34.

The saturation magnetizations and the coercive forces of the magnetic composite powders in Examples 17 to 22 were evaluated in the same method as above. The results are shown in Table 5.

TABLE 5

|  | Material Co/(Co + Fe) (Atomic ratio) | pH | Saturation Magnetization (emu/g) | Coercive Force (Oe) |
|---|---|---|---|---|
| Ex. 17 | 0.6 | 7.0 | 97.4 | 11.3 |
| Ex. 18 | 0.7 | 7.0 | 100.0 | 9.9 |
| Ex. 19 | 0.8 | 7.0 | 103.4 | 10.9 |
| Ex. 20 | 0.9 | 7.0 | 110.7 | 14.5 |
| Ex. 21 | 0.8 | 8.5 | 102.3 | 15.1 |
| Ex. 22 | 0.9 | 8.5 | 102.2 | 14.8 |

As can be seen from the result of Table 5, the magnetic composite powder of Example 20 comprising a Co—Fe magnetic layer in a Co/Fe atomic ratio of 0.9 exhibited the greatest saturation magnetization under the conditions of pH 7.0 and 15 min of plating time.

To evaluate the magnetic permeability of the inventive magnetic composite powder, the magnetic composite powder of Example was mixed with silicone resin and uniaxially pressed in a toroidal form to obtain a magnetic composite as a sample. The real part and imaginary part of magnetic permeability for the obtained sample were measured by using an impedance analyzer (E4991A, available from Agilent) depending on the frequency. The results are shown in FIGS. 3 and 4.

Figure 3:
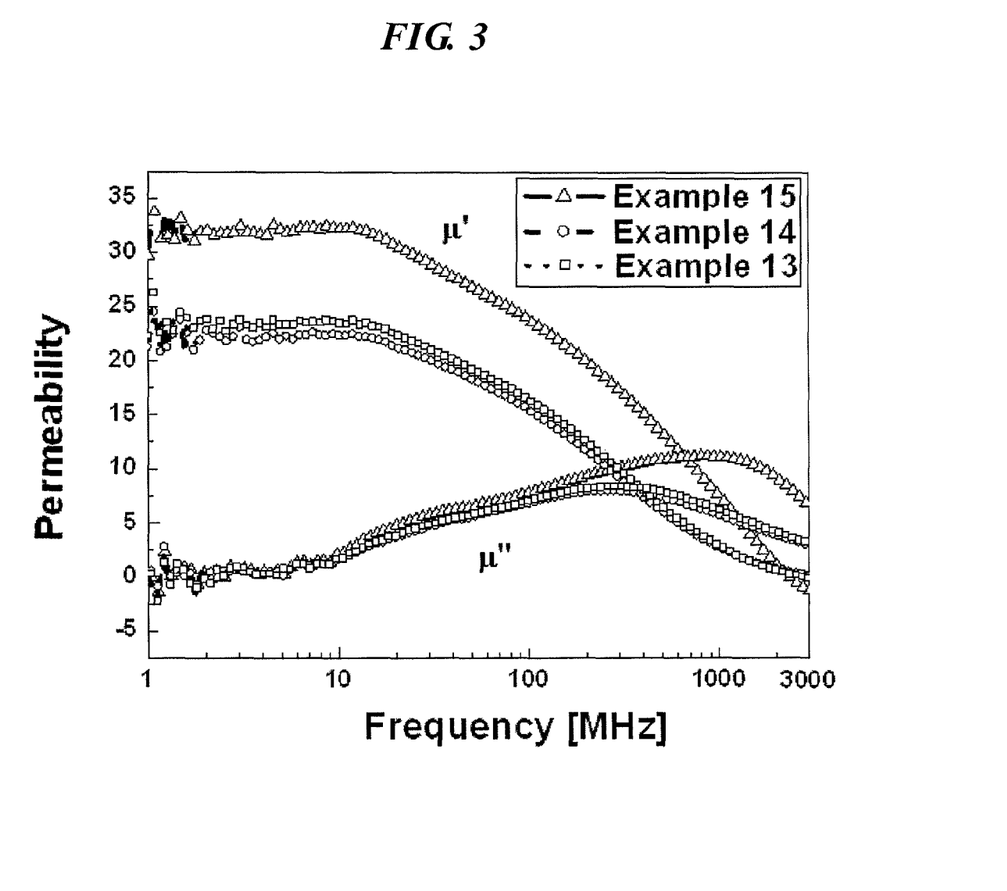
FIG. 3: a graph showing frequency dependences of magnetic permeability of the magnetic composites respectively comprising the magnetic composite powders of Examples 13 to 15.
Figure 4:
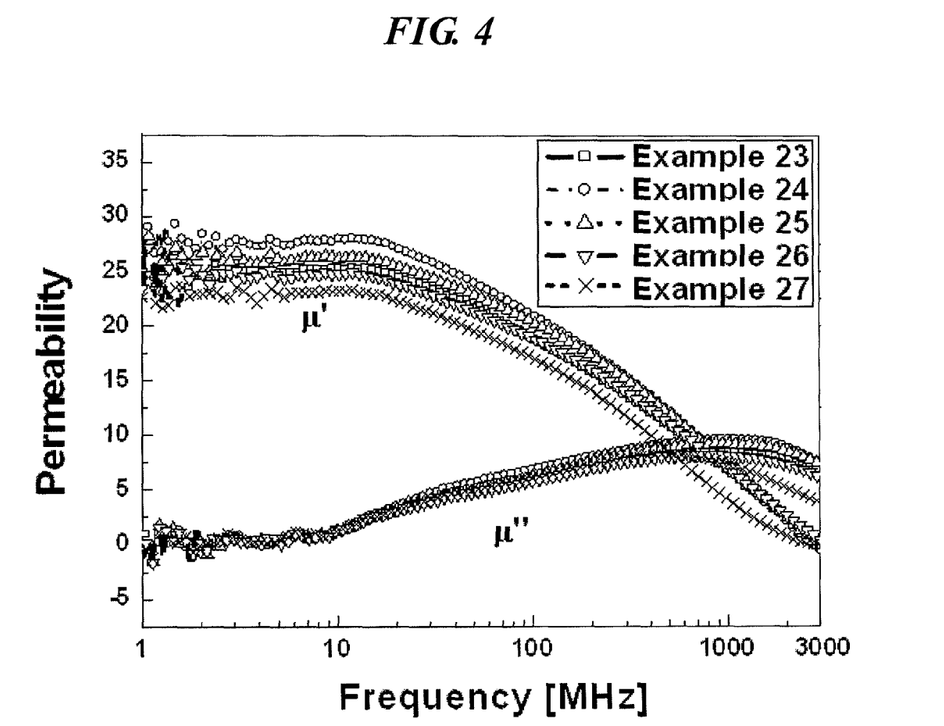
FIG. 4: a graph showing frequency dependences of magnetic permeability of the magnetic composites respectively comprising the magnetic composite powders of Examples 23 to 27.

FIG. 3 is a graph showing the frequency dependence of the magnetic permeability of the magnetic composites including the magnetic composite powder of Examples 13 to 15, and FIG. 4 is a graph showing the frequency dependence of the magnetic permeability of the magnetic composites including the magnetic composite powder of Examples 23 to 27.

As can be seen from the results of FIGS. 3 and 4, the magnetic composite respectively comprising the magnetic composite powder of Example 15 and 16 which were prepared by electroless plating at 35° C., pH 9.5 for 35 min and have the magnetic layer comprising a mixture of Co and Ni having a Co/Ni atomic ratios of 0.8 or 0.9, exhibited superior magnetic permeability and frequency dependence of the permeability. The magnetic composite comprising the magnetic composite powder of Example 24 having a mixture of Co and Fe alloy also exhibited relatively high magnetic permeability and frequency dependence.

Furthermore, return loss of the samples was measured by using a coaxial tube (inner diameter 3 mm×outer diameter 7 mm). The results are shown in FIGS. 5 and 6.

Figure 5:
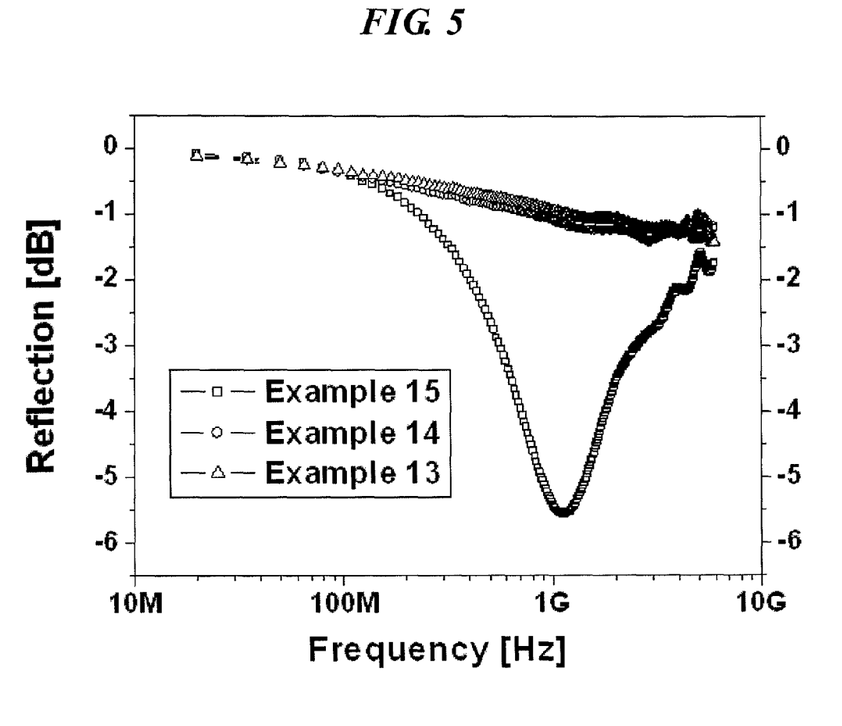
FIG. 5: a graph showing return losses of the magnetic composites respectively comprising the magnetic composite powders of Examples 13 to 15, depending on magnetic permeability.
Figure 6:
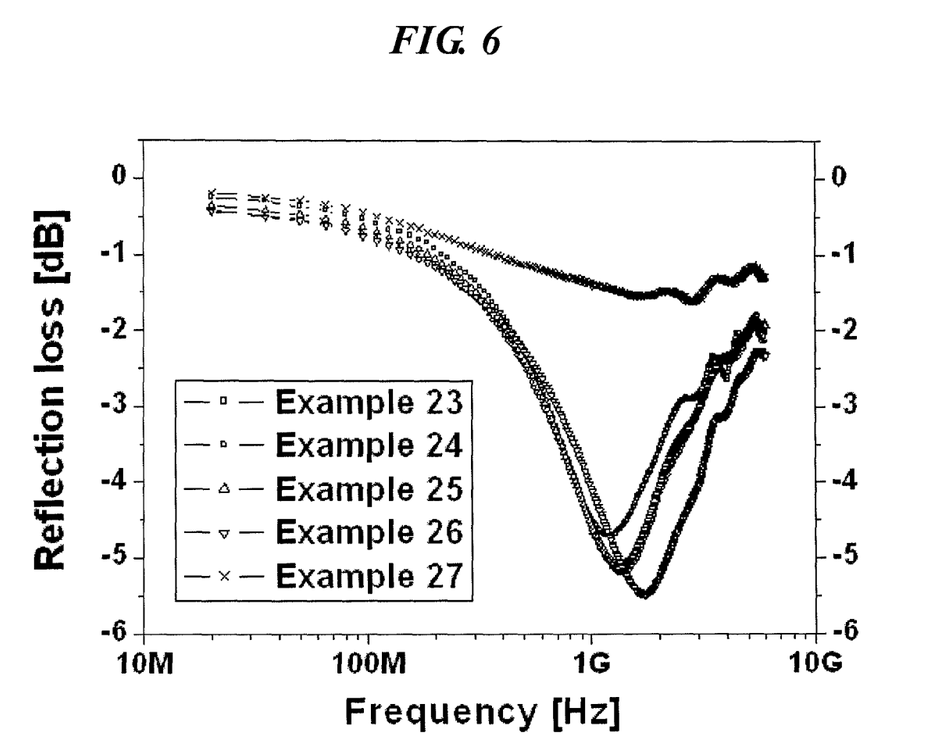
FIG. 6: a graph showing return losses of the magnetic composites including the magnetic composite powder of Examples 23 to 27, depending on permeability.

FIG. 5 is a graph showing the return loss of the magnetic composites comprising the magnetic composite powders of Examples 13 to 15 depending on the magnetic permeability, and FIG. 6 is a graph showing the return loss of the magnetic composites having the magnetic composite powder of Examples 23 to 27 depending on the magnetic permeability.

As shown in FIGS. 5 and 6, the magnetic composite comprising the magnetic composite powder of Example 15 exhibited the greatest return loss in the range of 1 GHz, and the magnetic composite comprising the magnetic composite powder of Examples 24 or 26 manifested the greatest return loss in the range of 1.5 and about 2 GHz respectively.

Example 35: Preparation of Electromagnetic Noise Suppressing Film

An electromagnetic noise suppressing film was prepared by using a slurry comprising 80 g of the magnetic composite powder obtained in Example 16 and 20 g of polyethylene chloride resin in accordance with a doctor blade method, which has a thickness of 0.1 mm and comprising the plate-like magnetic composite powder disposed in the resin in unidirectionally oriented manner.

Example 36: Preparation of Electromagnetic Noise Suppressing Film

Nickel nitrate and cobalt nitrate were mixed at an atomic ratio of 0.5:0.5 and the resulting mixture was dissolved in distilled water to a concentration of 50 g/l. Added to the resulting solution were succinic acid (to a concentration of 10 g/l, as a complexing agent), octyl ethanolate (to a concentration of 10 g/l, as an activating agent), sodium citrate (to a concentration of 50 g/l, as a buffering agent), and sodium hypophosphite (to a concentration of 25 g/l, as a reducing agent), and the pH of the resulting mixture was adjusted by adding aqueous ammonia to obtain a plating bath. Subsequently, plate-like ceramic core particles of BN (aspect ratio: 20) were placed in the plating bath, followed by performing electroless plating 35° C., to obtain a magnetic composite powder.

An electromagnetic noise suppressing film was prepared by using a slurry comprising 80 g of the magnetic composite powder obtained thus and 20 g of polyethylene chloride resin in accordance with a doctor blade method, which has a thickness of 0.1 mm and comprising the plate-like magnetic composite powder disposed in the resin in unidirectionally oriented manner.

Examples 37: Preparation of Electromagnetic Noise Suppressing Film

An electromagnetic noise suppressing film was prepared in the same method as in Example 36, except for using AlN instead of BN as the core material.

Comparative Example 1: Preparation of Electromagnetic Noise Suppressing Film

An electromagnetic noise suppressing film was prepared by using a slurry comprising 80 g of magnetic composite powder as a core particle and 20 g of polyethylene chloride resin in accordance with a doctor blade method, which has a thickness of 0.1 mm and comprising the plate-like magnetic composite powder disposed in the resin in unidirectionally oriented manner.

Evaluation of Properties of Electromagnetic Noise Suppressing Films

The power loss of the electromagnetic noise suppressing films of Example 35 and Comparative Example 1 was measured by a microstrip line method. The results are shown in FIG. 7.

The power loss evaluation by the microstrip line method was performed by attaching the film of each of Example 35 and Comparative Example 1 to the upper surface of microstrip lines made with 50Ω impedance and measuring S-parameters using a network analyzer (Network Analyzer 8753ES, available from Agilent).

Figure 7:
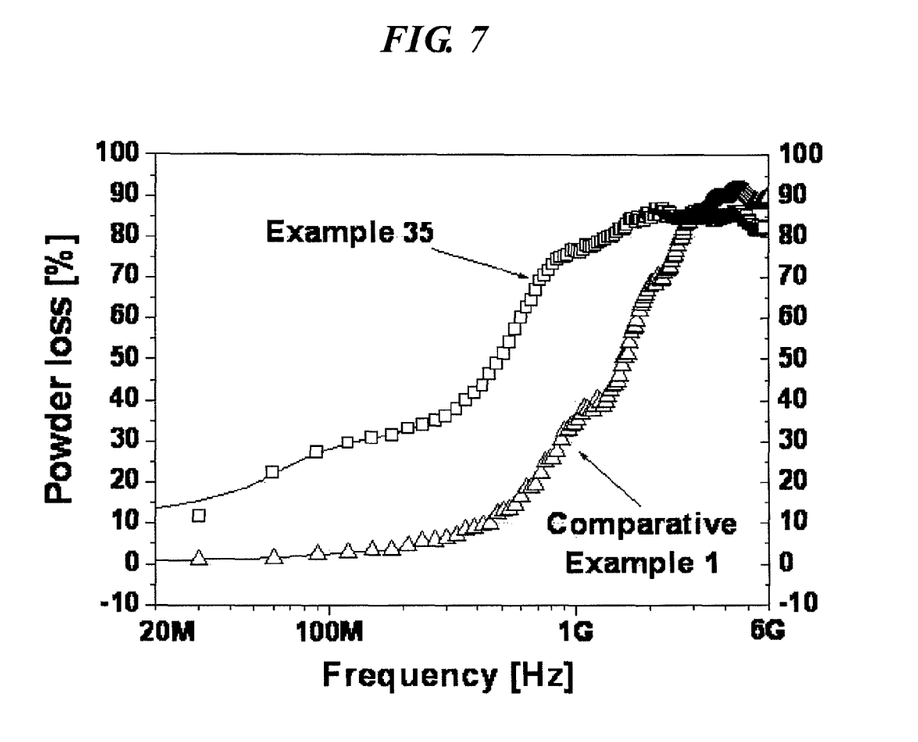
FIG. 7: a graph showing power losses of the electromagnetic noise suppressing films of Example 35 and Comparative Example 1.

FIG. 7 is a graph showing the power loss of the electromagnetic noise suppressing films of Example 35 and Comparative Example 1.

As shown in FIG. 7, the film of Example 35 exhibited power loss of 51.6% at 500 MHz, 76.7% at 1 GHz, and 85.7% or more at 2 GHz, which were higher than those of the film of Comparative Example 1 showing power loss of 12.8% at 500 MHz, 35.4% at 1 GHz and 68.5% at 2 GHz. From this result, the electromagnetic noise suppressing film according to the present invention can be seen to show superior electromagnetic noise absorption properties.

As described above, the magnetic composite powder according to the present invention has superior high-frequency response, thus shielding undesirable electromagnetic waves emitted from external electronic devices, preventing electromagnetic waves generated within the electronic devices from being emitted to the outside, and preventing malfunction of the device due to interference or radiation noise occurring between the transfer circuits within the device or due to the heat emitted from various parts of the device. Consequently, the inventive magnetic composite powder can effectively suppress unwanted electromagnetic waves emitted by an advanced digital device having high performance characteristics in terms of speed, frequency and functionality.

In addition, the electromagnetic noise suppressing film comprising the magnetic composite powder according to the present invention can effectively exhibit noise attenuation properties in the RF range upon attachment or insertion to the inside or topside of PCBs, digital devices, polymer films or FPCs, which radiate electromagnetic noise. Also, because passive elements are not mounted in the form of a part but can be applied in a thin form or an embedded form, the EMI of hard/soft circuit devices or flexible devices such as cables can be reduced. Furthermore, due to such effects, noise can be rapidly suppressed and electromagnetic or thermal interference occurring as a result of reducing the size of circuits and increasing the density thereof can be overcome.

While the invention has been described with respect to the above specified embodiments, it should be recognized that various modifications and changes may be made to the invention by those skilled in the art which also should fall within the scope of the invention as defined by the appended claims.

What is claimed is:

1. A magnetic composite powder having a core-shell structure, comprising:
   a core particle having shape anisotropy, wherein the core particle consists of a magnetic material selected from the group consisting of Fe—Al—Si crystalline alloy, Fe—Al—B—Nb—Cu crystalline alloy, Fe—Al—B—Nb crystalline alloy, Fe—Cr—Mo—C—B amorphous alloy, Fe—Si—B—Nb amorphous alloy, Fe—Zr—B—Ni amorphous alloy, Fe—Cu—Nb—Si—B amorphous alloy, Fe—Al—B—Nb amorphous alloy, Fe—Al—B—Cu amorphous alloy, Fe—Zr—B—Cu amorphous alloy, Co—Fe—Ni—B—Si amorphous alloy, Co—Fe—Ni—Mo—B—Si amorphous alloy, Ni—Cr—Fe—Si—B amorphous alloy, and Ni—Nb—Cr—Mo—P—B amorphous alloy, and
   a magnetic layer formed on the surface of the core particle wherein the magnetic layer is selected from the group consisting of Fe—Co—Ni—P—B, Fe—Ni—Zn—P, Fe—Ni—Cu—P, Co—Ni—Zn—P, Fe—Co—Ni—Zn—P, Co—Ni—Cu—P, Co—Fe—Cu—P, Fe—Co—Ni—Cu—P, and Fe—Ni—Zn—Cu—P;
   wherein the core particle has the shape of a plate or a needle.

2. The magnetic composite powder of claim 1, wherein the core magnetic material of the core particle is selected from the group consisting of Fe—Al—B—Nb—Cu crystalline alloy and Fe—Al—B—Nb crystalline alloy.

3. The magnetic composite powder of claim 1, wherein the magnetic material of the core particle is selected from the group consisting of Fe—Cr—Mo—C—B amorphous alloy, Fe—Si—B—Nb amorphous alloy, Fe—Zr—B—Ni amorphous alloy, Fe—Cu—Nb—Si—B amorphous alloy, Fe—Al—B—Nb amorphous alloy, Fe—Al—B—Cu amorphous alloy, Fe—Zr—B—Cu amorphous alloy, Co—Fe—Ni—B—Si amorphous alloy, Co—Fe—Ni—Mo—B—Si amorphous alloy, Ni—Cr—Fe—Si—B amorphous alloy, and Ni—Nb—Cr—Mo—P—B amorphous alloy.

4. The magnetic composite powder of claim 1, wherein magnetic material of the core particle is Fe—Cr—Mo—C—B amorphous alloy.

5. The magnetic composite powder of claim 1, wherein the magnetic material of the core particle is Fe—Si—B—Nb amorphous alloy.

6. The magnetic composite powder of claim 1, wherein the magnetic material of the core particle is Fe—Zr—B—Ni amorphous alloy.

7. The magnetic composite powder of claim 1, wherein the magnetic layer is Fe—Ni—Zn—Cu—P.

8. The magnetic composite powder of claim 1, wherein the core particle consists of a magnetic material selected from the group consisting of Fe—Cr—Mo—C—B amorphous alloy, Co—Fe—Ni—Mo—B—Si amorphous alloy, and Ni—Nb—Cr—Mo—P—B amorphous alloy.

9. The magnetic composite powder of claim 1, further comprising an AlN insulating layer between the core particle and the magnetic layer.

10. The magnetic composite powder of claim 1, wherein the core particle consists of a magnetic material selected from the group consisting of Fe—Zr—B—Ni amorphous alloy, and Fe—Zr—B—Cu amorphous alloy.

11. The magnetic composite powder of claim 1, wherein the magnetic layer is Fe—Co—Ni—P—B.

12. The magnetic composite powder of claim 1, wherein the magnetic layer is Fe—Co—Ni—Zn—P.

13. The magnetic composite powder of claim 1, wherein the magnetic layer is Co—Ni—Cu—P.

14. The magnetic composite powder of claim 1, wherein the magnetic layer is Fe—Co—Ni—Cu—P.

15. A magnetic composite powder having a core-shell structure, comprising:
  a core particle having shape anisotropy, the core particle consisting of:
    a ceramic selected from the group consisting of phosphoric acid, antimony oxide, magnesium hydroxide carbonate, and
    a magnetic material selected from the group consisting of Fe—Al—Si crystalline alloy, Fe—Al—B—Nb—Cu crystalline alloy, Fe—Al—B—Nb crystalline alloy, Fe—Cr—Mo—C—B amorphous alloy, Fe—Si—B—Nb amorphous alloy, Fe—Zr—B—Ni amorphous alloy, Fe—Cu—Nb—Si—B amorphous alloy, Fe—Al—B—Nb amorphous alloy, Fe—Al—B—Cu amorphous alloy, Fe—Zr—B—Cu amorphous alloy, Co—Fe—Ni—B—Si amorphous alloy, Co—Fe—Ni—Mo—B—Si amorphous alloy, Ni—Cr—Fe—Si—B amorphous alloy, and Ni—Nb—Cr—Mo—P—B amorphous alloy; and
  a magnetic layer formed on the surface of the core particle wherein the magnetic layer is selected from the group consisting of Fe—Co—Ni—P—B, Fe—Ni—Zn—P, Fe—Ni—Zn—B, Fe—Ni—Cu—P, Fe—Ni—Cu—B, Co—Ni—Zn—P, Co—Fe—Zn—P, Fe—Co—Ni—Zn—P, Co—Ni—Cu—P, Co—Fe—Cu—P, Fe—Co—Ni—Cu—P, Co—Ni—Cu—B, Co—Fe—Cu—B, Fe—Co—Ni—Cu—B, Fe—Ni—Zn—Cu—P, and Fe—Ni—Zn—Cu—B.

16. The magnetic composite powder of claim 15, wherein the core particle is Fe—Al—Si crystalline alloy.

17. A magnetic composite powder having a core shell structure, comprising:
  a core particle having shape anisotropy, the core particle comprising an AlN ceramic mixed with a magnetic material comprising Co—Fe—Ni—Mo—B—Si amorphous alloy;
  an insulating layer formed on the core particle; and
  a magnetic layer formed on the insulating layer, the magnetic layer comprising Fe—Ni—Zn—Cu—P.

* * * * *